United States Patent [19]

Takahashi

[11] Patent Number: 5,648,683

[45] Date of Patent: Jul. 15, 1997

[54] SEMICONDUCTOR DEVICE IN WHICH A FIRST RESIN-ENCAPSULATED PACKAGE IS MOUNTED ON A SECOND RESIN-ENCAPSULATED PACKAGE

[75] Inventor: Wataru Takahashi, Tokyo, Japan

[73] Assignee: Kabushiki Kaisha Toshiba, Kawasaki, Japan

[21] Appl. No.: 288,781

[22] Filed: Aug. 12, 1994

[30] Foreign Application Priority Data

Aug. 13, 1993  [JP]  Japan ................... 5-220521

[51] Int. Cl.⁶ ................... H01L 25/04; H01L 25/10
[52] U.S. Cl. ................... 257/685; 257/686; 257/723; 257/731; 257/696; 257/698
[58] Field of Search ................... 257/723, 724, 257/777, 778, 690, 698, 686, 730, 685, 696, 731, 732

[56] References Cited

U.S. PATENT DOCUMENTS

| | | | |
|---|---|---|---|
| 4,857,482 | 8/1989 | Saito et al. ................... | 257/737 |
| 4,956,694 | 9/1990 | Eide ................... | 257/686 |

FOREIGN PATENT DOCUMENTS

| | | | |
|---|---|---|---|
| 0104549 | 7/1984 | Japan . | |
| 0254762 | 12/1985 | Japan ................... | 257/686 |
| 0144664 | 6/1989 | Japan ................... | 257/686 |
| 0169958 | 7/1989 | Japan ................... | 257/696 |
| 0022849 | 1/1990 | Japan ................... | 257/693 |
| 0239651 | 9/1990 | Japan ................... | 257/730 |
| 0228356 | 10/1991 | Japan ................... | 257/730 |
| 0103142 | 4/1992 | Japan ................... | 257/723 |
| 0665060 | 4/1988 | Switzerland ................... | 257/686 |

*Primary Examiner*—Peter Toby Brown
*Attorney, Agent, or Firm*—Oblon, Spivak, McClelland, Maier & Neustadt, P.C.

[57] ABSTRACT

A semiconductor device in which a control element is buffered from the effect caused by a power element whose heating value is greater than that of the control element, so as to provide the semiconductor device of multiple-chip configuration and having stable operating characteristics within a guaranteed range. The semiconductor device includes: a first unit including a first resin package having a plurality of a semiconductor elements therein; a support member which is projected from the first unit; and a second unit including a second resin package having at least one semiconductor element therein, whereby the second unit is disposed over the first unit by way of the support member, wherein the first unit has a lead insertion hole so that a lead extending from the second resin package in the second unit is electrically connected to the first resin package in the first unit, and the top surface of the support member is in contact with the bottom face of the second resin package so that there is provided a space between the first and second resin packages to buffer heat generated by the semiconductor elements in the first resin package.

9 Claims, 8 Drawing Sheets

FIG.9A
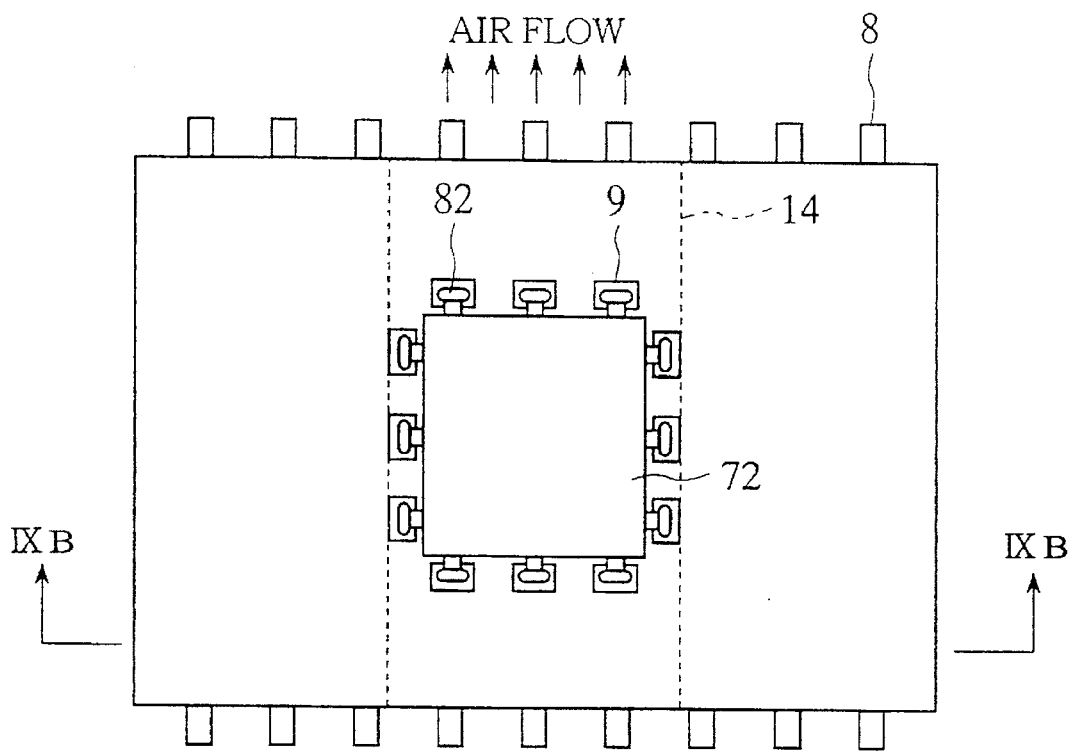
FIG.9B
FIG.9C
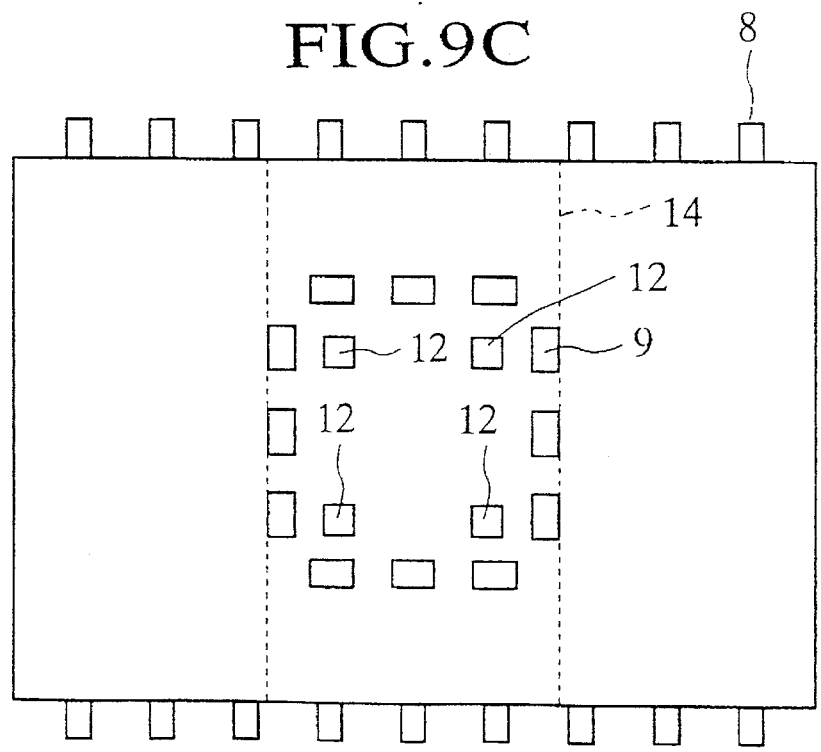

1

SEMICONDUCTOR DEVICE IN WHICH A FIRST RESIN-ENCAPSULATED PACKAGE IS MOUNTED ON A SECOND RESIN-ENCAPSULATED PACKAGE

BACKGROUND OF THE INVENTION

1. Technical Field

The present invention relates to a semiconductor device having a plurality of semiconductor devices and, more particularly, to the semiconductor device in which a plurality of power elements are controlled by a control element.

2. Background Art

A power element is a semiconductor element which supplies electric power to a load. As the power element, there are a power transistor, a power MOSFET (metal-oxide-semiconductor field-effect transistor), an IGBT (insulated gate bipolar mode transistor) and so on. The control element, such as control ICs and CPU, is the semiconductor device by which the power element is controlled.

Recently, in order to further advancement in densification and miniaturization of the semiconductor device, there is used a multiple-chip package where a chip for a semiconductor element (hereinafter simply referred to as a chip) such as a plurality of integrated-circuit elements and an individual semiconductor element, is packaged in a single package. Though there is used a circuit base plate such as a printed board, serving as a on-chip substrate in this type of package, a lead frame is often utilized for a general use. The lead frame is made of Cu (copper) or an alloy mainly composed of Cu. In the lead frame, there are equipped therein an island for placing the chip thereon, a pin or lead for supporting the island, and so on. The chip is placed on the circuit base plate or lead frame, and is resin-packaged, thereby constituting a prescribed circuit.

Referring to FIG. 1 and FIG. 2, described is a semiconductor device which constitutes an H bridge circuit for driving a motor.

FIG. 1 is a top view of the semiconductor device (element) in the conventional practice. FIG. 2A and FIG. 2B are cross sectional views substantially taken along lines IIA—IIA and IIB—IIB shown in FIG. 1, respectively. In the semiconductor shown in FIG. 1, the chip is formed by placing it on the lead frame. The lead frame 3 has island 82 for mounting the chip thereon; in FIG. 1, there are five islands 32 to mount fives chips, and a power element chip 1 is connected and fixed to the island 32 by a solder 4 or the like (FIG. 2A and FIG. 2B). Referring to FIG. 1, a control element chip 2 is provided on a centrally located island 32, and is fixed with the solder 4. In order to electrically connect a lead 33 of the lead frame 3 to each chip, a joint electrode (not shown) formed in each chip and an inner lead portion in an end of the lead 33 are connected with a bonding wire 5 (FIGS. 2A and 2B) such as an Au wire.

After chips 1, 2 are fabricated on the lead frame 3 in the manner described above, the lead frame 3 is assembled to a mold forming metal pattern along with a heat-radiating plate 6 such as Cu. Then, after performing a transfer mold formation, a packaging process is carried out utilizing a thermoplastic resin such as an epoxy resin. Thereafter, a short-circuit portion of the lead frame 3 is cut and formed. As a result thereof, the plastic package 7 completely covers the chips 1, 2 and islands 32, and the heat-radiating plate 6 (FIGS. 2A and 2B) is placed under the plastic package 7.

Referring to FIGS. 2A and 2B, the upper surface and side face of the heat-radiating plate 6 are covered with the package 7, and the underside of the heat-radiating plate 6 is exposed. The inner lead portion to which the bonding wire 5 of the lead 33 is connected, is resin-packaged, whereas an outer lead portion 8 (FIG. 2B) which is electrically connected to a circuit in other side, is exposed from the plastic package 7. The outer lead 8 is often in the form of being bent so that it may be easily mounted to the circuit based plate and the like.

In the semiconductor devices presenting these multiple-chip package configuration, a problem is caused because both the power elements and the control element coexist on the same plastic package. Since two different types of chips coexist thus, for example, an environmental temperature of the control element is affected by the heat generated by the power element upon energization thereof. As a result thereof, a characteristic of the control element is changed unwantedly, so that a guarantee accuracy for each characteristic in an overall device is deteriorated. For example, it is to be noted that a Zener voltage In the Zener diode utilized as a reference voltage supply among control elements, and the resistance of detection resistance for detecting the current are generally temperature-dependent. Therefore, the more the degree in decrease of the environmental temperature becomes, the greater the unwanted characteristic difference becomes.

SUMMARY OF THE INVENTION

In view of the foregoing drawbacks, it is therefore an object of the present invention to buffer the control element from the effect caused by the power element whose heating value is greater than that of the control element, so as to provide a semiconductor device of multiple-chip configuration capable of improving the guarantee accuracy.

To achieve the object, there is provided a semiconductor device comprising: a first unit including a first package having a plurality of semiconductor elements therein; support means which is projected from the first unit; and a second unit including a second package having at least one semiconductor element therein, the second unit being disposed over the first unit by way of the support means for supporting the second unit, wherein the first unit has a lead insertion hole so that a lead extending from the second package in the second unit is electrically connected to the first package in the first unit, and the top surface of the support means is in contact with the bottom face of the second package so that there is provided a space between the first and second units to buffer heat generated by the semiconductor elements in the first package.

BRIEF DESCRIPTION OF THE DRAWINGS

These and other objects, features and advantages of the present invention will become more apparent from the following description of the preferred embodiment taken in conjunction with the accompanying drawings, in which:

FIG. 9A is a plan view of the semiconductor device according to the third embodiment.

FIG. 9B is a vertical cross section of the semiconductor device taken substantially along lines IXB and IXB.

FIG. 9C is a plan view of the first package shown in FIG. 9A.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

With reference to FIG. 3–FIG. 7, the first embodiment according to the present invention will be described in detail.

Figure 1:
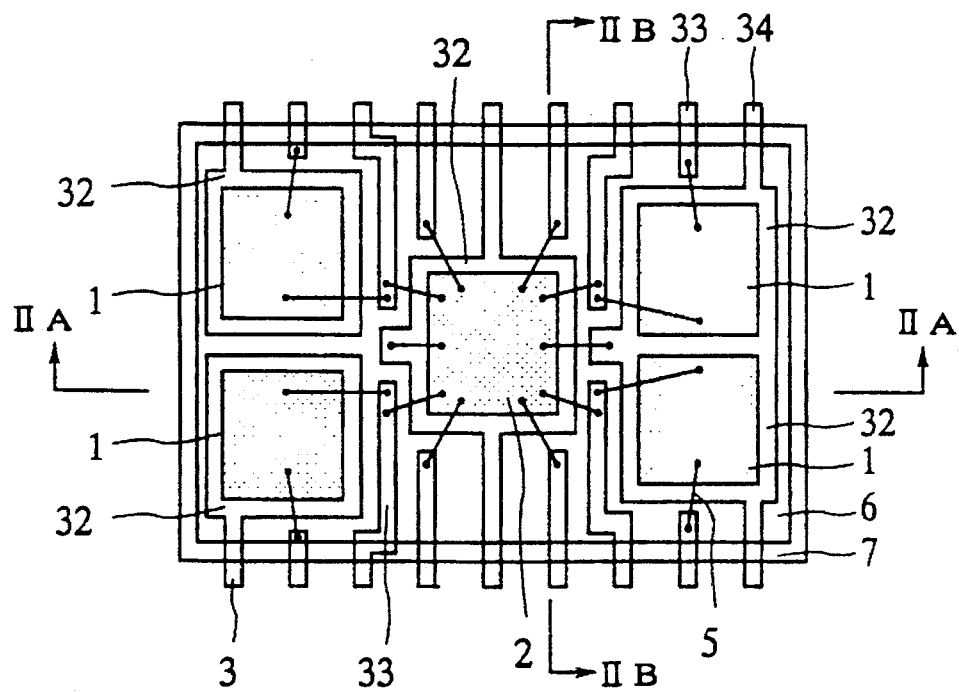
FIG. 1 is a top view of the semiconductor device (element) in the conventional practice.
Figure 2A:
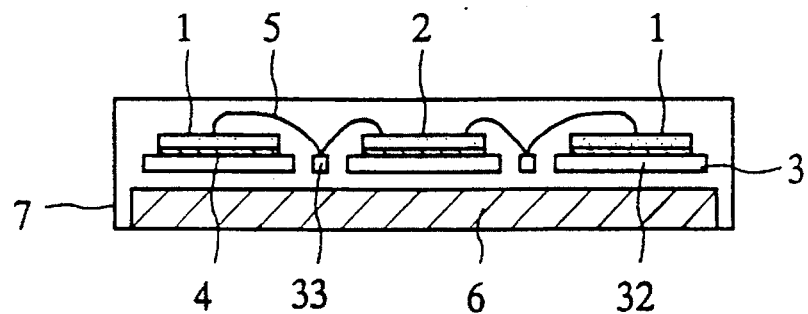
FIG. 2A and FIG. 2B are cross sectional views substantially taken along lines IIA—IIA and IIB—IIB shown in FIG. 1, respectively.
Figure 2B:
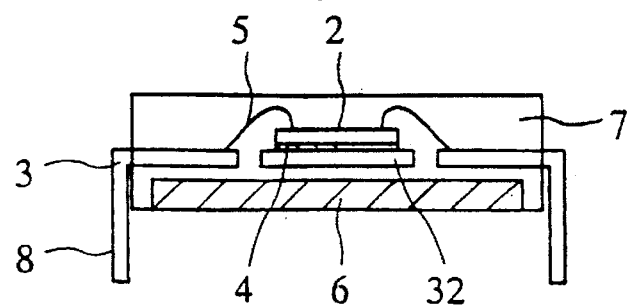
Figure 3:
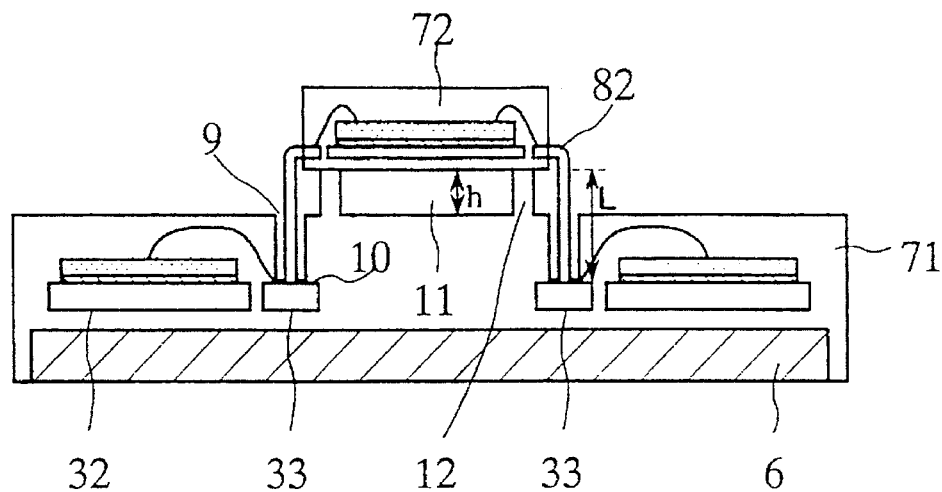
FIG. 3 is a cross sectional view of a semiconductor device according to the first embodiment of the present invention.
Figure 4:
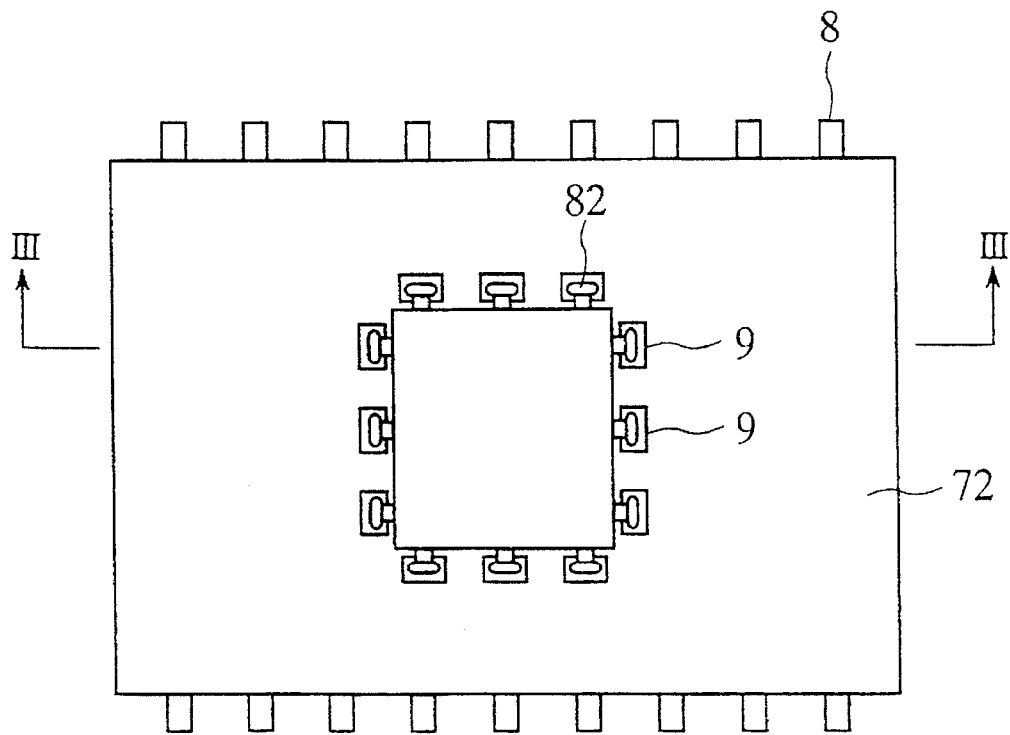
FIG. 4 is a top view of the semiconductor device shown in FIG. 3.

FIG. 3 is a cross sectional view of a semiconductor device according to the first embodiment of the present invention. FIG. 4 is a top view of the semiconductor device shown in FIG. 3.

Figure 5:
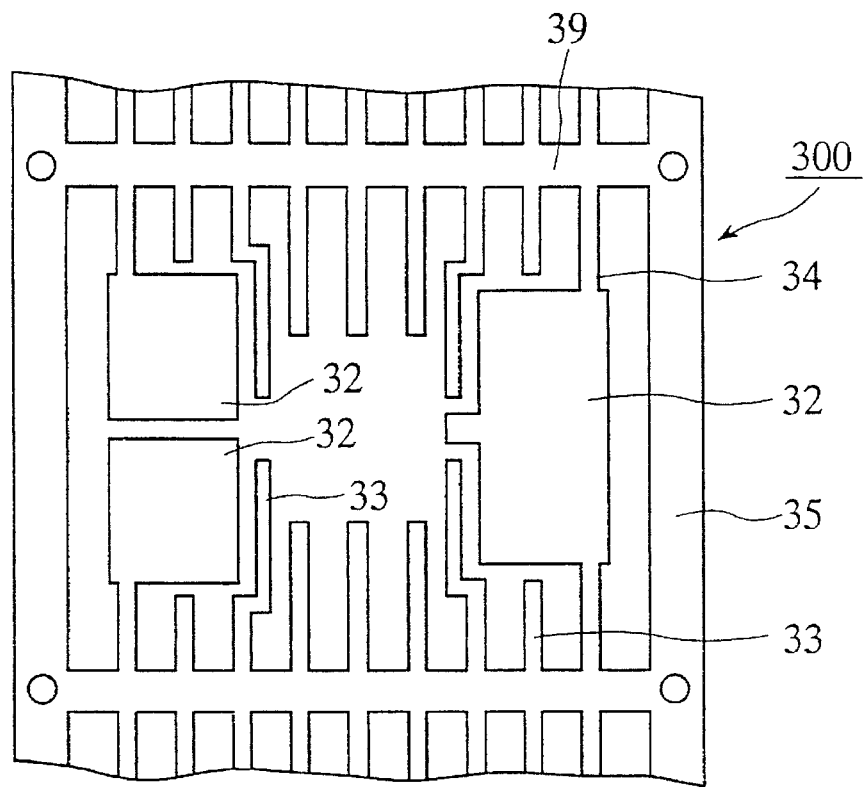
FIG. 5 Is a plan view of a lead frame utilized to form a first package.
Figure 6:
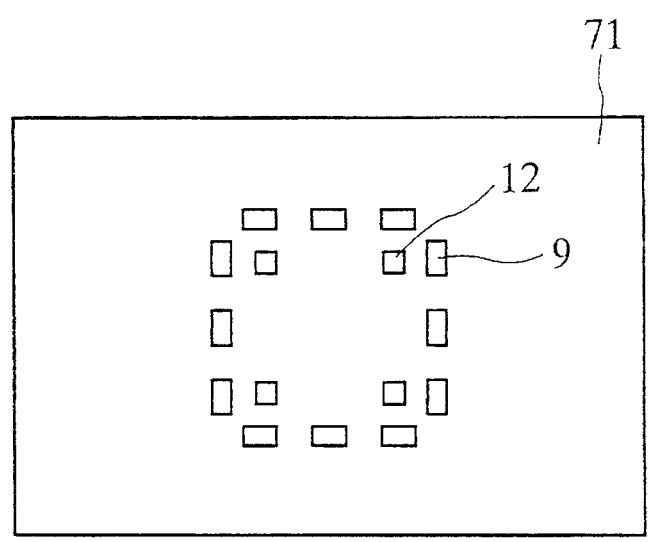
FIG. 6 is a plan view of the first package.
Figure 7:
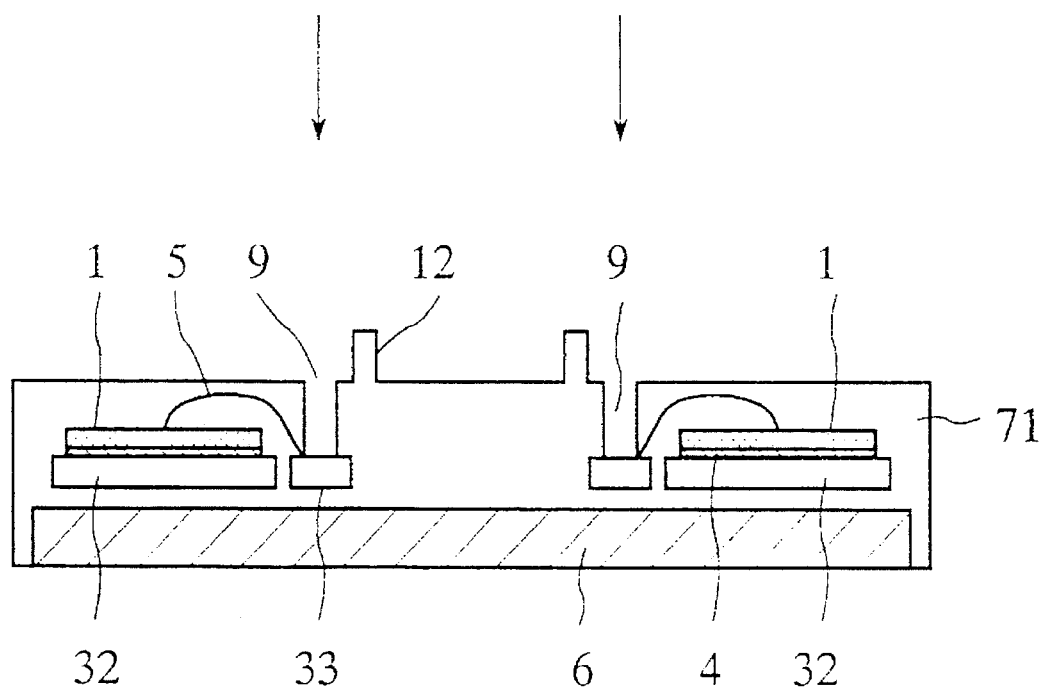
FIG. 7 are cross sectional views of the semiconductor device showing a manufacturing process thereof.

FIG. 5 is a plan view of a lead frame utilized to form a first package, while FIG. 6 is a plan view of the first package. FIG. 7 are cross sectional views of the semiconductor device showing a manufacturing process thereof.

In the first embodiment, the semiconductor device is comprised of a first unit on which a power element is provided, and a second unit on which a control element is provided. The first unit is composed of the first package, and the second unit is composed of the second package. The feature of the present invention is characterized in that the second package is provided above the first package.

Referring to FIG. 3, the second package 72 is mounted over the first package 71 by way of a support portion 12 which is projected from the first package 71. On the upper surface of the first package 71, there is provided a through hole leading toward an inner portion of the first package 71. In other words, the through hole serves as a lead insertion hole 9. At the bottom face of the lead insertion hole 9, a part of the lead 33 is exposed. It is to be noted that the lead 33 is covered by the first package 71. The support portion 12 is formed in the upper surface of the first package 71 in a manner that the support portion 12 is surrounded by the lead insertion hole 9. An outer lead 82 extended from the second package 72 is inserted into the lead insertion hole 9 so that an end of the outer lead 82 is connected to the lead 33 inside the first package 71 and is fixed with a solder 10 or the like.

The top surface of the support portion 12 is in contact with the bottom face of the second package 72 so that the bottom face of the second package is not directly adhered to the first package. In this example for the first embodiment, the power element (chip) 1 is provided in the first package 71, and the control element (chip) 2 is provided in the second package 72. In other words, there is provided a space between the first and second packages 71, 72 by means of the support portion 12. As a result thereof, even in the event that there is generated a heat from the power element 1 due to electrical energization, a degree to which the heat radiated from the first package 71 affects the second package 72 can be minimized. Thereby, deterioration of the control element 2 in the second package 72 is also minimized.

Referring to FIG. 3 and an upper part of FIG. 7, a length L of outer lead 82 (extending from the second package 72) between the bottom and the top as shown in the figures may be approximately 3–4 mm, while the height h of the support portion 12 may be approximately 1–3 mm so that there can be formed an effective space to avoid a heat transfer from the power element 1. It is to be noted that, in this example, the first package 71 is of square shape of approximately 50–100 mm. The second package 72 placed over the first package 71 is a square of QFP (quad flat package) type. It shall be appreciated that those elements may be of DIP (dual-in-line package) type that is a rectangular shape, where a short side thereof may be approximately 6–15 mm and a long side thereof may be approximately more than 10 mm.

Accordingly, a package equivalent to a single semiconductor device is provided into two portions. Thus, the package having a semiconductor whose property is liable to change due to the heat is separated from the package having a semiconductor that comparatively radiates more heat. Thereby, heat-related influence can be minimized. Moreover, those separate packages are configured as one placed upon another, so that an occupying area therefor will not increase.

Next, referring to FIG. 5–FIG. 7, a production process of the semiconductor device according to the above first embodiment will be described.

A chip is fabricated on a lead frame 300 and is then resin-packaged so as to form the first package. FIG. 5 is a plan view of the lead frame 300. A lead 33 and a hanger pin 34 are supported by a frame portion 35 and a tie bar 39 supported by the frame portion 35. An island 32 to which the chip is mounted is supported by the hanger pin 34. As for material of the lead frame 300, there is preferably used a copper which has an enough mechanical strength and presents good heat conductivity. The copper utilized may be an oxygen free copper whose purity is 99.96 weight % or greater, or one whose purity is 99.8 weight % or greater, including Fe (iron) of approximately 0.05–0.15 weight % and P (phosphorus) of approximately 0.025–0.04 weight %.

For example, there are provided four islands in the lead frame 300, where two of which may be configured in an integrated manner as shown in FIG. 5. On each island 32, there is fabricated thereon a chip of the power element such as a power transistor and IGBT. The power element chip is fixed to the island by way of the solder 4 whose melting point is approximately 300° C.

In order to electrically connect the lead 33 of the lead frame 300 to each chip, a connecting electrode (not shown) formed at each chip is connected to an end of an inner lead portion of the lead 33 through a bonding wire 5 (FIG. 7) such as Au (gold).

Next, after the chip 1 is fabricated on the lead frame 300, the lead frame 300 is assembled to a mold forming metal pattern together with a heat-radiating plate 6 such as Cu.

Then, after performing a transfer mold formation, a packaging process is carried out utilizing a thermoplastic resin such as an epoxy resin so that the packaging resin becomes the first package 71. By forming the mold, there are formed a plurality of support portions 12 or protruding portions 12 on the surface of the first package 71 (FIG. 6).

Next, referring to FIG. 6, by performing an etching process or the like, there are formed a plurality of lead insertion holes 9 in a manner that the insertion holes 9 surround the support portions 12 (protruding portions 12) and they are provided inward from the surface of the first package 71. Referring to FIG. 3, FIG. 4 and FIG. 7, an inner lead portion of the lead 33 in the first package 71 is exposed at the bottom face of the lead insertion hole 9. The resin package 71 completely covers the chip 1 and the island 32, and the heat-radiating plate 6 is provided in a lower portion within the resin package 71 so that the bottom face of the heat-radiating plate 6 is exposed.

In other words, the heat-radiating plate 6 is covered by the resin package 71 in its upper surface and its side, and the lower face that is the bottom face of the heat-radiating plate is exposed. Referring to FIG. 7, the inner lead portion at which the boding wire 5 of the lead 33 is connected is resin-packaged, while an outer lead portion 8 which is to be electrically connected to other circuit (FIG. 4) is exposed from the resin package 71.

After an above resin packaging process is completed and the lead insertion hole 9 is formed in the first package 71, a short-circuit portion of the lead frame 300 is cut and removed. The outer lead 8 may be bent so that it can be easily mounted to the circuit base plate or the like. This completes a package formation process.

On the other hand, though the second package 72 utilizes the lead frame, the island on which the chip is mounted is only a single unit, in this example. As the chip for the second package 72, there may be utilized the control IC or a control element such as a CPU (central processing unit). The lead frame (not shown) is made of Cu or an alloy composed mainly of Cu. The control element 2 is connected and fixed to the island 36 (FIG. 7) by utilizing, for example, a refractory solder 4 whose melting point is approximately 300° C. Referring to FIG. 7, an end of the outer lead portion of the lead 37 formed from the lead frame is disposed counter to the control element 2 of the island 36, and is electrically connected to an electrode (not shown) in the control element 2 by way of a bonding wire such as an Au wire.

Still referring to FIG. 7, an outer lead portion 82 that is other end of the lead 37 is bent so that the end thereof is bent downward. Referring to FIG. 4 and FIG. 7, in this first embodiment, the leads 37 of the lead frame utilized to form the second package 72 are directed to four directions, so that the outer leads 82 for the second package 72 are extended from four sides. The second package 72 made of the resin package covers the control element 2, the solder 4, the island 36, the inner lead portion of the lead 37 and the bonding wire 51, whereas the outer lead portion 82 of the lead 37 is exposed (FIG. 7). In other words, after the control element chip 2 which is mounted on the island 36 of the lead frame is resin-packaged, an unnecessary portion of this lead frame is cut and the lead is formed, so as to form the second package 72.

The second package 72 thus produced is placed over the first package 71 in which the power element 1 on the lead frame 300 is mold-formed.

Referring to FIG. 7, first, the lead 82 extending from the second package 72 is each inserted to the lead-insertion hole 9 in first package 71 so that the lead 82 comes in contact with the inner lead portion which is disposed in an end of the lead 33 and is exposed in a bottom portion of the lead-insertion hole 9.

Thereafter, the inner lead portion is fixed and electrically connected to the end of the outer lead 82 by, for example, solder 10 whose melting point is rather low such as approximately 200° C. It is preferred that the inner lead portion of the lead 33 and the outer lead 82 are connected in a manner of double adhesion. The double adhesion means that both tips of the inner lead portion and the outer lead 82 are coated with the solder 10. The solder 10 is, in advance, coated on the surface of the inner lead portion, and then the outer lead 82 is placed thereon, so that the inner lead portion and the outer lead 82 are bonded together by applying the heat thereto.

In the double-adhesion process, the solder 10 utilized for bonding has a low melting point. Moreover, it is necessary that the melting point for this solder 10 is lower than that of the refractory solder 4 used for connecting the chip and the island. Thereby, the solder 4 used to fix and connect the chip and the island can be prevented from being melted in the event of the double adhesion (solder 10) by a heat process.

It shall be appreciated that if a soldering technique in which an air blow having high-temperature is locally applied to a bonding portion so that the bonding portion alone is locally heated, there will be no absolute need to use the solder 10 whose melting point is thus low as described above.

FIG. 4 is a plan view showing a finished product of the semiconductor device. In the above embodiment, there is used a DIP-type device configuration in which the outer leads 82 are extended from two sides of the device one of which faces other, and they are bent downward.

By this novel device configuration according to the present invention, it can prevent the conventional problem where the property of the control element is deteriorated by influence of the heat generated by the power elements and guarantee accuracy for each characteristic in the semiconductor device is also deteriorated, since the control elements and power elements are mixedly configured in the same package in the conventional semiconductor device.

Second Embodiment

Figure 8A:
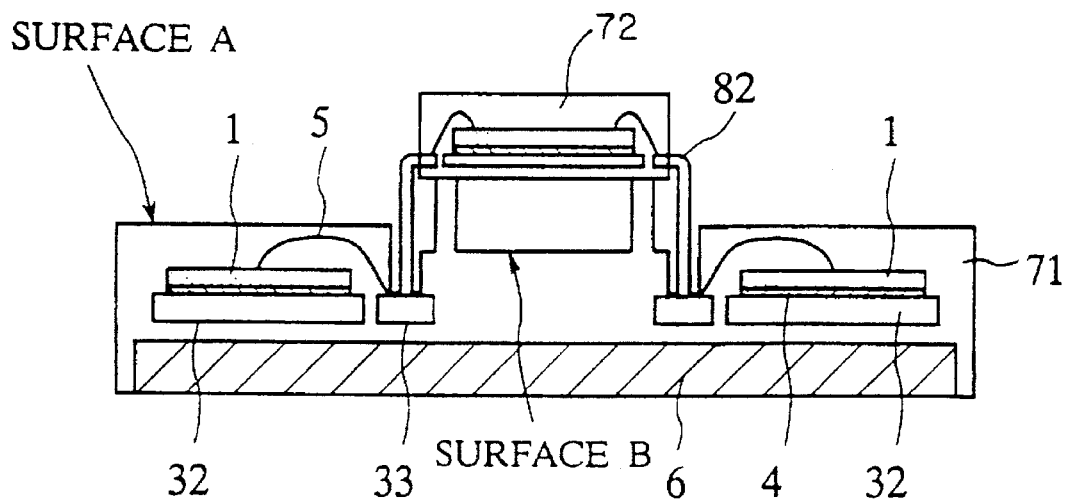
FIG. 8A is a cross sectional view of the semiconductor device according to the second embodiment.
Figure 8B:
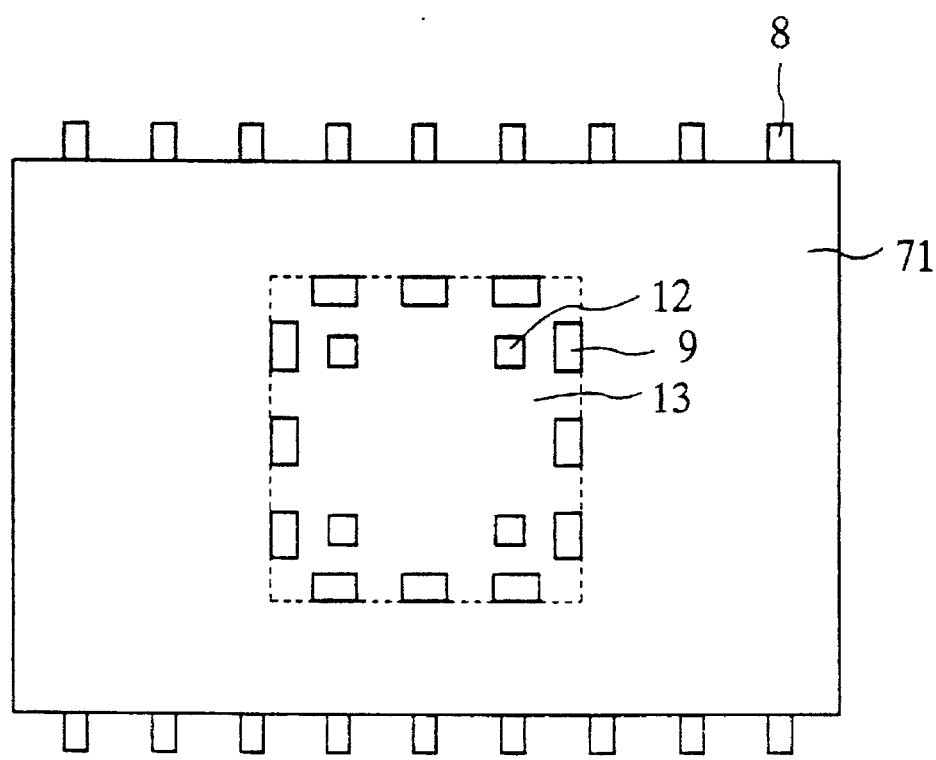
FIG. 8B is a plan view of the first package of the semiconductor device shown in FIG. 8B.

The second embodiment will be described with reference to FIGS. 8A and 8B. FIG. 8A is a cross sectional view of the semiconductor device according to the second embodiment. FIG. 8B is a plan view of the first package of the semiconductor device shown in FIG. 8B.

The semiconductor device shown in FIG. 8A is constituted by the first unit on which a power element is provided, and a second unit on which a control element is provided. The first unit is composed of the first package, and the second unit is composed of the second package. The second package is provided above the first package.

The second package 72 is mounted over the first package 71 by way of a support portion 12 which is projected from the first package 71. On the upper surface of the first package 71, there is provided a through hole leading toward an inner portion of the first package 71. In other words, the through hole serves as a lead insertion hole 9. At the bottom face of the lead insertion hole 9, a part of the lead 33 covered by the first package 71 is exposed. It is to be noted that the lead 33 is covered by the first package 71. The support portion 12 is formed in the upper surface of the first package 71 in a manner that the support portion 12 is surrounded by the lead insertion hole 9. An outer lead 82 extended from the second package 72 is inserted into the lead insertion hole 9 so that an end of the outer lead 82 is connected to the lead 33 inside the first package 71 and is fixed with a solder 10 or the like.

The top surface of the support portion 12 is in contact with the bottom face of the second package 72 so that the bottom face of the second package is not directly adhered to the first package. The power element 1 is provided in the first package 71, and the control element 2 is provided in the second package 72. In other words, there is provided a space between the first and second packages 71, 72 by means of the support portion 12. As a result thereof, even in the event that there is generated and radiated a heat from the power element 1 due to electrical energization, a degree to which the heat radiated from the first package 71 affects the second package 72 can be minimized. Thereby, deterioration of the property of the control element 2 in the second package 72 is also minimized. In this second embodiment, the second package 72 is a square of QFP (Quad Flat Package) type.

As described above, inner construction of both the first and second packages is similar to that in the first embodiment. Moreover, a shape for the second package is similar to that of the first embodiment. The feature of the second embodiment lies in the shape of the first package. There is provided a concave portion 13 in an area on which the second package 72 is mounted and which is surrounded by the lead-insertion hole 9 on the surface B of the first package 71. In other words, as shown in FIG. 8A, the surface B of the first package 71 is configured below the surface A of the first package 71. The support portion 12 that comes in contact with the second package 72 is projected from and formed in the concave portion 13.

In order to further improve the first embodiment in terms of the area occupancy for the second package 72 which is placed on the first package 71, the second embodiment is characterized in that the thickness of the overall semiconductor device is reduced since there is formed the concave portion 13 in the first package and the second package 72 is placed in the concave portion 13. Moreover, even though there is the concave portion 13 on the first package 71, a space between the first and second packages is secured as in the first embodiment because of the support portion 12 projected from the first package 71. Thanks to the space provided by the support portion 12 projected from the first package, the heat radiated from the first package 71 is effectively avoided.

Third Embodiment

With reference to FIGS. 9A and 9B, the third embodiment will be described.

FIG. 9A is a plan view of the semiconductor device according to the third embodiment. FIG. 9B is a vertical cross section of the semiconductor device taken substantially along lines IXB and IXB. FIG. 9C is a plan view of the first package shown in FIG. 9A.

The semiconductor device shown in FIG. 9A is constituted by the first unit on which a power element is provided, and a second unit on which a control element is provided. The first unit is composed of the first package, and the second unit is composed of the second package. The second package is provided above the first package.

The second package 72 is mounted over the first package 71 by way of a support portion 12 which is projected from the first package 71. On the upper surface of the first package 71, there is provided a through hole leading toward an inner portion of the first package 71. In other words, the through hole serves as a lead insertion hole 9. At the bottom face of the lead insertion hole 9, a part of the lead 33 covered by the first package 71 is exposed. It is to be noted that the lead 33 is covered by the first package 71. The support portion 12 is formed in the upper surface of the first package 71 in a manner that the support portion 12 is surrounded by the lead insertion hole 9. An outer lead 82 extended from the second package 72 is inserted into the lead insertion hole 9 so that an end of the outer lead 82 is connected to the lead 33 inside the first package 71 and is fixed with a solder 10 or the like.

The top surface of the support portion 12 is in contact with the bottom face of the second package 72 so that the bottom face of the second package is not directly adhered to the first package. The power element 1 is provided in the first package 71, and the control element 2 is provided in the second package 72. In other words, there is provided a space between the first and second packages 71, 72 by means of the support portion 12. As a result thereof, even in the event that there is generated and radiated a heat from the power element 1 due to electrical energization, a degree to which the heat radiated from the first package 71 affects the second package 72 can be minimized. Thereby, deterioration of the property of the control element 2 In the second package 72 is also minimized. In this third embodiment, the second package 72 is a square of QFP (Quad Flat Package) type.

As described above, inner construction of both the first and second packages is similar to that in the first embodiment. Moreover, a shape for the second package is similar to that of the first embodiment. The feature of the third embodiment lies in the shape of the first package.

As shown in FIG. 9A, the third embodiment is characterized in that on the surface of the first package 71 there is provided a groove 14 from one side to other side counter to the one side of the first package. It shall be appreciated that the groove 14 may be provided in a manner that it passes through all of four sides. Referring to FIG. 9A, a region of the groove 14 includes the area on which the second package 72 is mounted and which is surrounded by the lead insertion hole 9 on the first package 71. The support portion 12 which supports and comes in contact with the bottom face of the second package 72 is projected from the groove 14.

In order to further improve the second embodiment in terms of air flow, i.e., in order to further shield the heat radiated from the first package 71, there is formed the groove 14 on the surface of the first package 71 so that the air flows (as indicated in the arrow marks In FIG. 9A) through the space between the groove 14 and the second package 72 to help escape the heat radiated from the first package 71.

Since there are formed the concave portion 13 and the groove 14 in the second and third embodiments, the package is comparatively thin in the portion where there is formed the concave portion 13 or the groove 14. Thus, it is preferable that a power chip is not positioned inside the package where there is formed the concave portion 13 or groove 14. In other words, the concave portion 13 is preferably formed so that nothing is disposed below or there is disposed only a lead therebelow.

Fourth Embodiment

Figure 10:
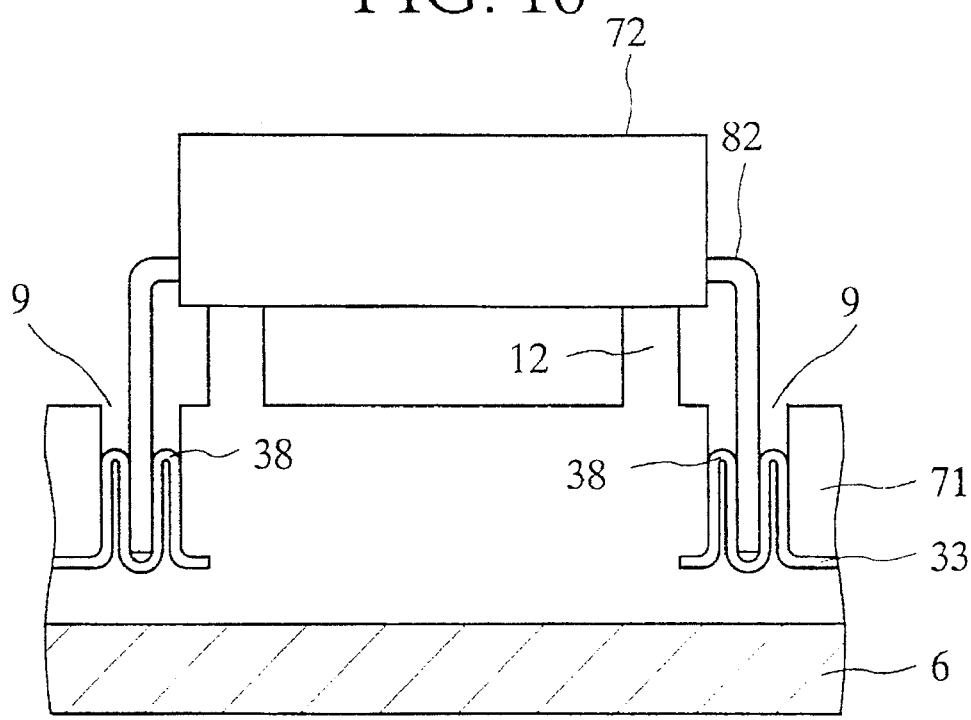
FIG. 10 is an enlarged cross sectional view of a portion where the second package 72 is placed into the first package 71, according to the fourth embodiment.

With reference to FIG. 10, the fourth embodiment according to the present invention will be described.

Figure 11:
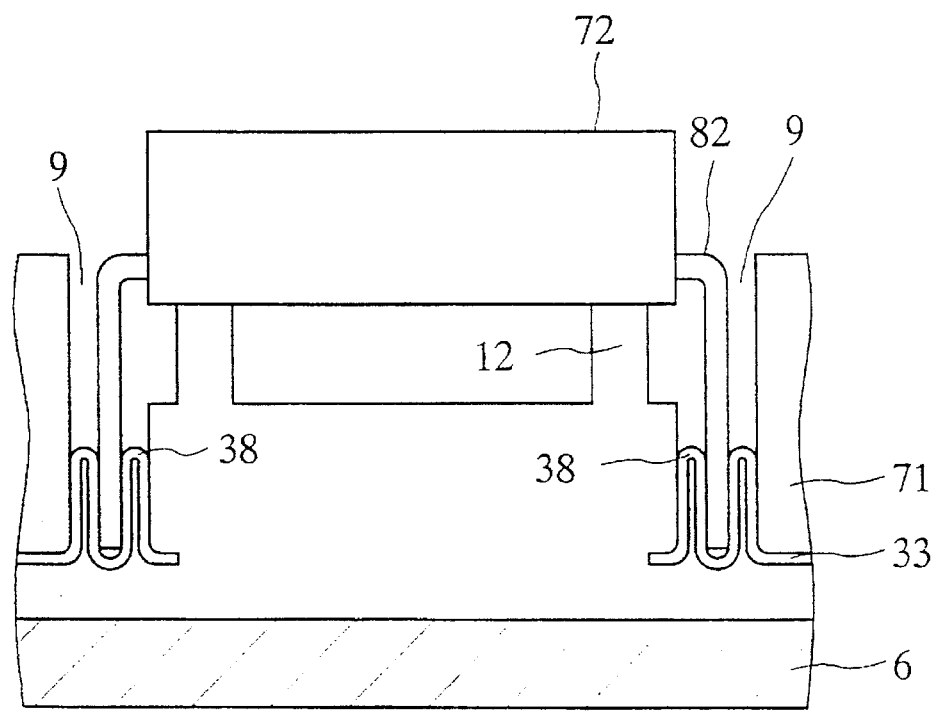
FIG. 11 is another example showing an enlarged cross section view of the portion where the second package 72 is placed into the first package 71, shown in FIG. 10.

FIG. 10 is an enlarged cross sectional view of a portion where the second package 72 is placed into the first package 71, according to the fourth embodiment. FIG. 11 is another example showing an enlarged cross section view of the portion where the second package 72 is placed into the first package 71, shown in FIG. 10. The shape of the first package 71 shown in FIG. 11 corresponds to that shown in the second embodiment.

In the above first through third embodiments, the outer lead extended from the second package 72 is connected by means of the solder. The connecting means therefor is not limited to the solder alone. The connection means may be by welding or a socket.

In the case of the welding, care shall be taken for possible breakage of an insulating film due to electric charge at the time of welding. As for connection realized by the socket, the tip of the lead 33 exposed in the bottom face of the lead insertion hole 9 in the first package 71, may be so processed that, for example, there is formed a socket 38 of elastic nature, as shown in FIG. 10. Thereby, this socket 38 holds the tip of the outer lead 82 extended from the second package 72. The socket 38 may be of any type available conventionally.

The socket 38 or the like may be utilized for the first package 71 described in the second embodiment or the third embodiment, as shown in FIG. 11.

In the fourth embodiment, since the tip of the outer lead 82 extended from the second package 72 is gripped and held by the socket 38, the second package 72 can be disconnected from the first package 71 via the socket 38 with ease. Thus, the semiconductor device according to the fourth embodiment is suitable for supplying a custom-made product. In this connection, for example, the semiconductor device can be used for a desirable type of motor, by properly selecting the control element.

Modifications

Next, with reference to FIGS. 12A–12C, some variations for the support portion 12 projected from the first package 71 of the first unit will be described.

Figure 12A:
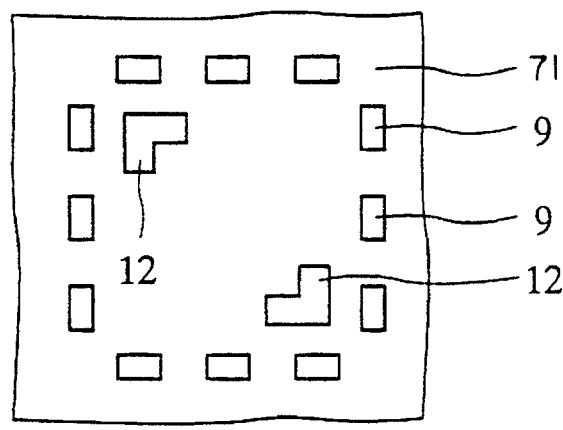
FIGS. 12A–12C show the first package 71 viewed from the top thereof, in order to show variations for the support portion 12 projected from the second package 72.
Figure 12B:
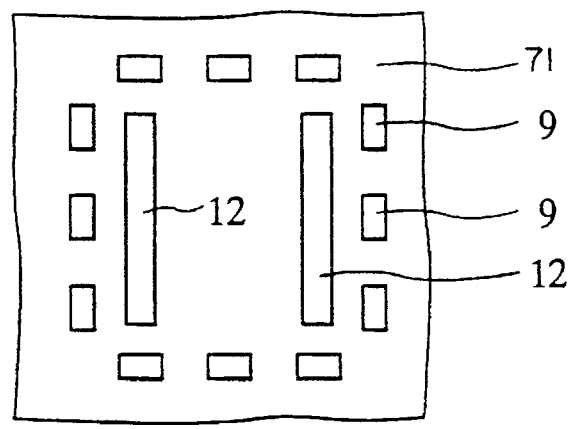
Figure 12C:
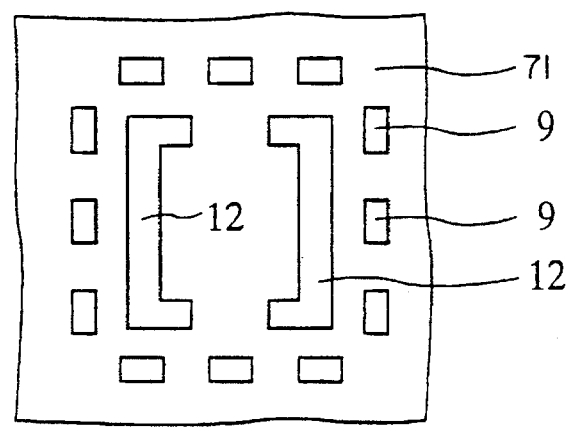

FIGS. 12A–12C show the first package 71 viewed from the top thereof. The plural support portions are necessary to provide a predetermined space between the first and second packages. However, more than necessary number of the support portions will be undesirable.

In FIG. 12A, there are provided two of support portions 12 whose cross section is L-shaped, one of which may be rubbed or given a mark so as to be distinguished from other. By giving thus some sort of distinguishing mark to the support portion, it can serve as a guidance in the event that the second package is to be mounted over the first package.

FIG. 12B and FIG. 12C show other examples to show variations of the shapes for the support portion. In the figures, there are shown support portions having more surface area compared to the L-shaped support portion shown in FIG. 12A. In these examples, though somehow sacrificing the air flow compared to the support portion shown in FIG. 12A, the second package can be more securely placed over the first package since the support portion has a larger surface area.

As described so far, the semiconductor device according to the present invention is equipped with the first unit and the second unit, and the second unit which is mounted on the first unit by way of the support portion contains a single package. However, the second unit is not limited to one composed of a single package alone. The second unit may contain more than two packages, which are to be mounted on the first unit by way of the support portions. Moreover, though there is provided a single chip in the single package in the second unit in the above embodiments, the package in the second unit may contain and equipped with a plurality of chips, as well.

In summary, by employing the novel present invention, the package having the power elements is effectively separated from the package having the control element, so that the heat generated from the power elements can be substantially shielded against the control element because the heat radiated from the power elements is hindered effectively by the space provided therebetween. Thus, the environmental temperature range for the control element is equivalent to that of the semiconductor device being packaged, so that the guarantee accuracy for each property of the semiconductor device is significantly improved.

Besides those already mentioned above, many modifications and variations of the above embodiments may be made without departing from the novel and advantageous features of the present invention. Accordingly, all such modifications and variations are intended to be included within the scope of the appended claims.

What is claimed:

1. A semiconductor device comprising:

a first resin package having a plurality of a semiconductor elements resin-encapsulated therein;

support means which is projected from the first resin package; and a second resin package having at least one semiconductor element resin-encapsulated therein, the second resin package being disposed over the first resin package by way of the support means for supporting the second resin package, wherein the first resin package has a lead insertion hole so that a lead extending from the second resin package is electrically connected to the first resin package, and the top surface of the support means is in contact with the bottom face of the second resin package so that there is provided a space between the first and second resin packages to buffer heat generated by the semiconductor elements in the first resin package, wherein a solder is, in advance, coated on the surface of an inner lead portion in the first resin package and a tip of the lead extended from the second resin package is connected to the inner lead portion, so that the inner lead portion and tip of the lead extended from the second resin package are bonded together by applying heat thereto, and wherein a melting point for the solder is lower than that of a refractory solder used for connecting a chip and an island inside the first and second resin packages.

2. The device of claim 1, wherein the first resin package includes a power element which supplies electric power to a load driven by the device, and the second resin package includes a control element which controls the power element.

3. The device of claim 1, wherein a length of the lead extended and exposed from the second resin package is approximately 3–4 mm while the height of the support means is approximately 1–3 mm.

4. The device of claim 3, wherein the first resin package is of square shape of approximately 50–100 mm and the second resin package placed over the first package is a square quad flat package (QFP).

5. The device of claim 3, wherein the first resin package and the second resin package are dual-in-line packages where a short side thereof is approximately 6–15 mm and a long side thereof is greater than 10 mm.

6. The device of claim 1, wherein at the bottom of the lead insertion hole in the first resin package there is provided socket means which is of elastic nature and holds the tip of the lead extended from the second resin package, whereby the second resin package can be disconnected from the first resin package via the socket means with ease.

7. The device of claim 1, wherein said support means comprises a resinous portion of said first resin package projected from the first resin package.

8. A semiconductor device comprising:

a first resin package having a plurality of a semiconductor elements resin-encapsulated therein;

support means which is protected from the first resin package; and a second resin package having at least one semiconductor element resin-encapsulated therein, the second resin package being disposed over the first resin package by way of the support means for supporting the second resin package, wherein the first resin package has a lead insertion hole so that a lead extending from the second resin package is electrically connected to the first resin package, and the top surface of the support means is in contact with the bottom face of the second resin package so that there is provided a space between the first and second resin packages to buffer heat generated by the semiconductor elements in the first resin package, wherein a shape of the first resin package includes a concave portion in an area on which the second resin package is mounted and the first resin package includes plural lead insertion holes provided on the surface of the first resin package surrounding said concave portion.

9. A semiconductor device comprising:

a first resin package having a plurality of a semiconductor elements resin-encapsulated therein;

support means which is protected from the first resin package; and a second resin package having at least one semiconductor element resin-encapsulated therein, the second resin package being disposed over the first resin package by way of the support means for supporting the second resin package, wherein the first resin package has a lead insertion hole so that a lead extending from the second resin package is electrically connected to the first resin package, and the top surface of the support means is in contact with the bottom face of the second resin package so that there is provided a space between the first and second resin packages to buffer heat generated by the semiconductor elements in the first resin package, wherein on the surface of the first resin package there is provided a groove from one side to other side counter to said one side of the first resin package, a region of the groove including an area on which the second resin package is mounted and the first resin package includes plural lead insertion holes provided on the first resin package surrounding the area on which the second resin package is mounted.

\* \* \* \* \*